United States Patent
Lee et al.

(10) Patent No.: US 7,487,413 B2
(45) Date of Patent: Feb. 3, 2009

(54) MEMORY MODULE TESTING APPARATUS AND METHOD OF TESTING MEMORY MODULES

(75) Inventors: Jung-kuk Lee, Yongin-si (KR);
Seung-jin Seo, Suwon-si (KR);
You-keun Han, Yongin-si (KR);
Seung-man Shin, Suwon-si (KR);
Young-man Ahn, Yongin-si (KR)

(73) Assignee: Samsung Electronics Co., Ltd., Suwon-si, GYeonggi-do (KR)

( * ) Notice: Subject to any disclaimer, the term of this patent is extended or adjusted under 35 U.S.C. 154(b) by 343 days.

(21) Appl. No.: 11/398,719

(22) Filed: Apr. 6, 2006

(65) Prior Publication Data

US 2006/0230249 A1 Oct. 12, 2006

(30) Foreign Application Priority Data

Apr. 7, 2005 (KR) ...................... 10-2005-0029093

(51) Int. Cl.
*G11C 29/00* (2006.01)
(52) U.S. Cl. ..................................... 714/718
(58) Field of Classification Search .................. 714/718
See application file for complete search history.

(56) References Cited

U.S. PATENT DOCUMENTS

| 6,772,261 | B1 | 8/2004 | D'Antonio et al. |
| 7,197,676 | B2 * | 3/2007 | Co et al. ...................... 714/718 |
| 7,234,081 | B2 * | 6/2007 | Nguyen et al. ................ 714/42 |
| 2005/0138267 | A1 * | 6/2005 | Bains et al. .................. 711/100 |
| 2006/0206764 | A1 * | 9/2006 | Lu et al. ....................... 714/36 |
| 2007/0174718 | A1 * | 7/2007 | Fouquet-Lapar ............. 714/42 |

FOREIGN PATENT DOCUMENTS

| JP | 55163699 | 12/1980 |
| JP | 9288153 | 11/1997 |
| KR | 1020010065681 | 7/2001 |

* cited by examiner

*Primary Examiner*—James C Kerveros
(74) *Attorney, Agent, or Firm*—Volentine & Whitt, PLLC

(57) ABSTRACT

A memory module testing apparatus and method include a test slot adapted to receive a target memory module, wherein the target memory module includes a first memory unit to store information related to the target memory module. The memory module testing apparatus further includes a second memory unit adapted to store information related to a memory module, and a first switching unit adapted to selectively provide a driving signal to at least one of the first memory unit and the second memory unit.

25 Claims, 7 Drawing Sheets

MEMORY MODULE TESTING APPARATUS AND METHOD OF TESTING MEMORY MODULES

BACKGROUND OF THE INVENTION

1. Field of the Invention

Embodiments of the invention relate to a memory module testing apparatus. In particular, embodiments of the invention relate to a memory module testing apparatus capable of testing various types of memory modules.

This application claims priority to Korean Patent Application No. 10-2005-0029093, filed on Apr. 7, 2005, the subject matter of which is hereby incorporated by reference in its entirety.

2. Description of the Related Art

A memory device is a storage device used to temporarily or permanently store data used in a digital logic system. Because the occurrence of a failure in a memory device may cause a fatal error in a system operation in the system in which the memory device is used, manufactured memory devices are tested in a system (e.g., a motherboard) that simulates their actual working environment before being released into the market.

In general, a conventional motherboard used to test manufactured memory devices will support a standard dual in-line memory module (DIMM), that is, a conventional motherboard will be able to test a standard DIMM. A conventional motherboard that supports a standard DIMM will also support some small outline dual in-line memory module (SODIMM) products.

Since a memory module testing apparatus performs test(s) in a pin-to-pin manner, if a target memory module (i.e., a memory module to be tested) has a different pin scheme than the interface pin scheme of the motherboard, an interface board must be used with the memory module testing apparatus in order to perform test(s) on the target memory module. For example, the standard DIMM has 184 pins while the standard SODIMM may have 200 pins. Thus, an interface board is required when a SODIMM is tested using a memory module testing apparatus adapted to support the standard DIMM.

However, when a conventional memory module testing apparatus tests a SODIMM, a motherboard using a standard DIMM only supports ×8 1-rank, ×8 2-rank, and ×16 1-rank SODIMM products without supporting ×16 2-rank SODIMM products. As a result, the conventional memory module testing apparatus cannot test ×16 2-rank SODIMM products.

SUMMARY OF THE INVENTION

Embodiments of the invention provide a memory module testing apparatus adapted to test various types of memory modules.

In one embodiment, the invention provides a memory module testing apparatus comprising a test slot adapted to receive a target memory module, wherein the target memory module comprises a first memory unit adapted to store information related to the target memory module. The memory module testing apparatus further comprises a second memory unit adapted to store information related to a memory module, and a first switching unit adapted to selectively provide a driving signal to at least one of the first memory unit and the second memory unit.

In another embodiment, the invention provides a memory module testing apparatus comprising a first test slot adapted to receive a target memory module, the target memory module comprising a first memory unit adapted to store information related to the target memory module. The memory module testing apparatus further comprises a second test slot, a second memory unit adapted to store information related to a memory module, a first switching unit adapted to selectively switch chipset signals between the first test slot and the second test slot, and a second switching unit adapted to selectively provide a first driving signal to at least one of the first memory unit and the second memory unit.

In yet another embodiment, the invention provides a memory module testing method for a memory module testing apparatus comprising; a chipset, first and second test slots, a target memory module mounted in the first test slot and comprising a first memory unit adapted to store information related to the target memory module, a second memory unit, and first and second switching units. The method comprises providing a driving signal to the second memory unit during a booting process of the memory module testing apparatus to enable the chipset to read information stored in the second memory unit, and providing the driving signal to the first memory unit after completion of the booting process to allow the information stored in the first memory unit to be tested.

BRIEF DESCRIPTION OF THE DRAWINGS

Exemplary embodiments of the invention will be described in detail with reference to the accompanying drawings, in which like reference symbols refer to like or similar elements. In the drawings.

DESCRIPTION OF THE EXEMPLARY EMBODIMENTS

Figure 1:
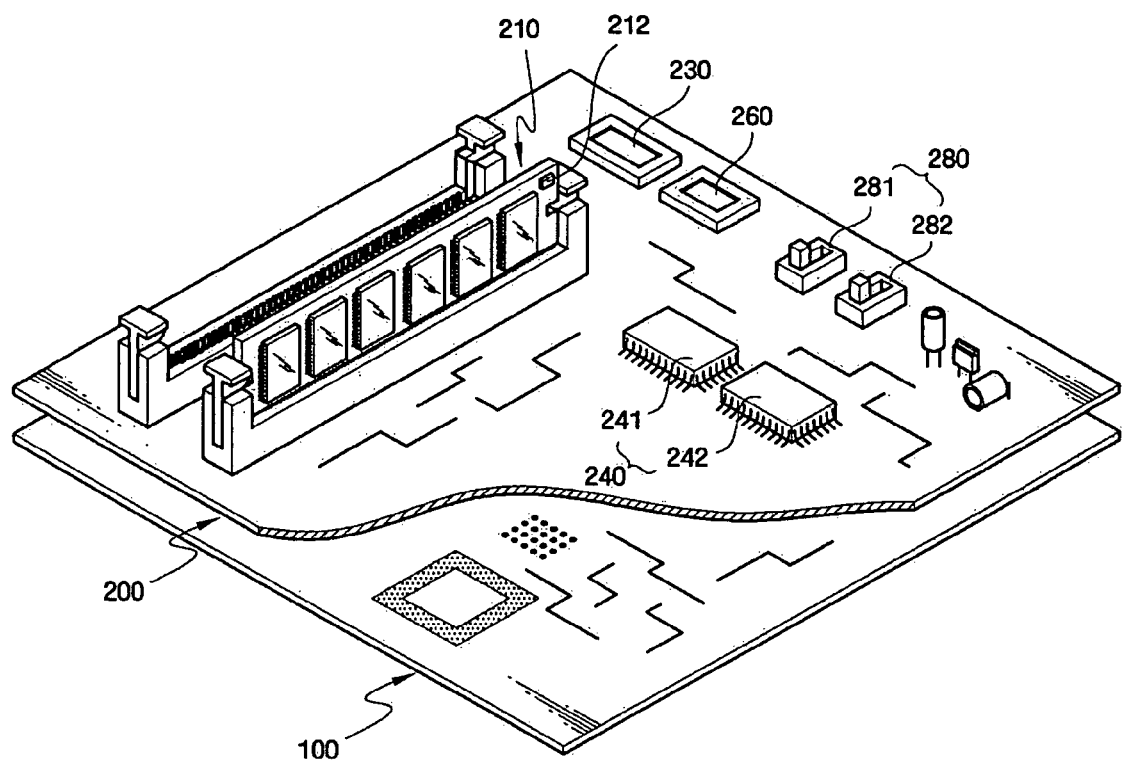
FIG. 1 is a perspective view of a memory module testing apparatus in accordance with an exemplary embodiment of the present invention.
Figure 2:
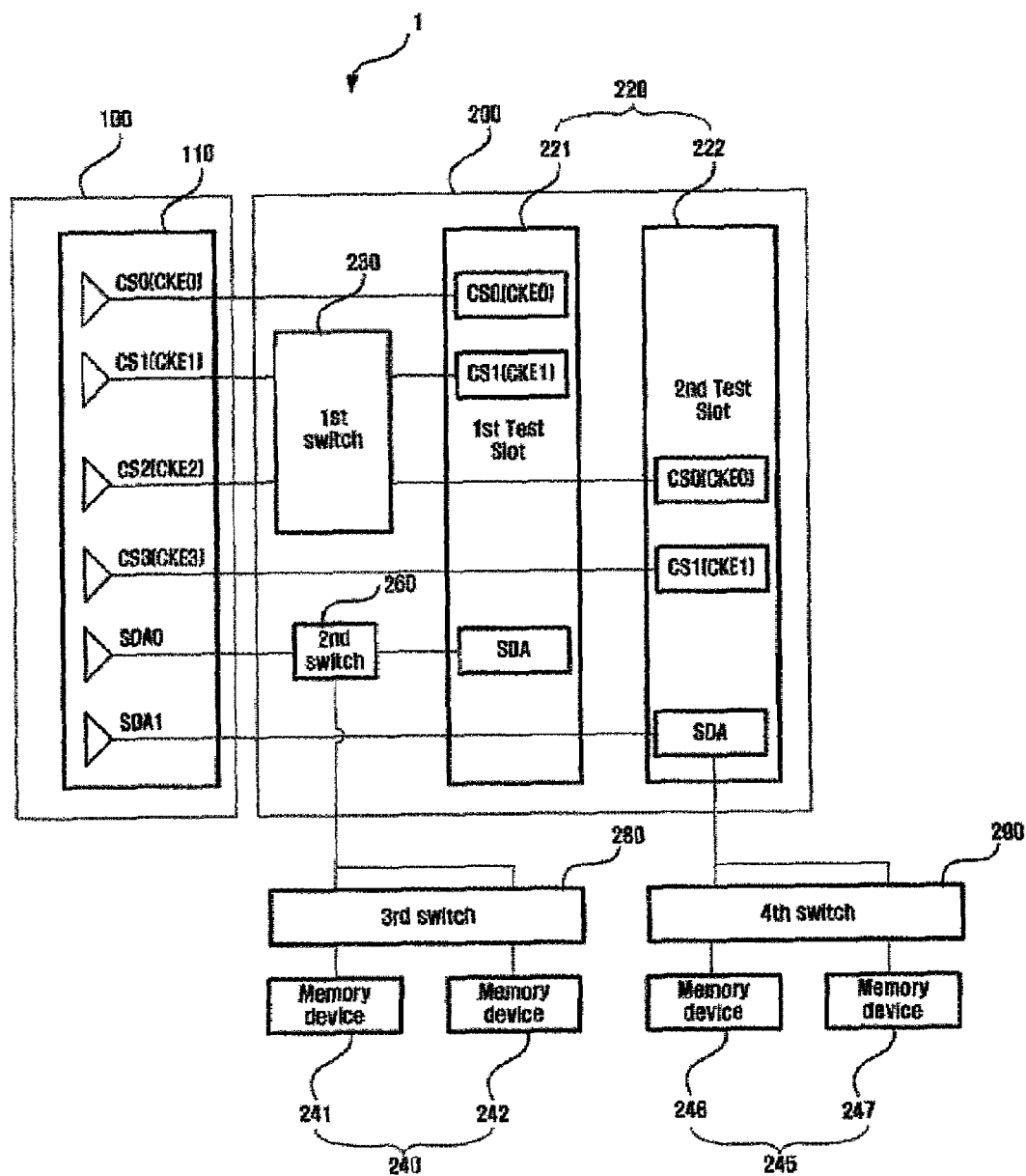
FIG. 2 is a block diagram of a memory module testing apparatus in accordance with an exemplary embodiment of the present invention.

FIG. 1 is a perspective view of a memory module testing apparatus in accordance with an exemplary embodiment of the present invention, and FIG. 2 is a block diagram of a memory module testing apparatus in accordance with an exemplary embodiment of the present invention.

The structure of interface board 200 shown in FIG. 1 is only an exemplary structure for interface board 200. The structure of interface board 200 can take various forms in accordance with the environment in which a target memory module 210 is used, wherein target memory module 210 is the memory module that will be tested using the memory module testing apparatus of FIG. 1. For simplicity, a detailed configuration of interface board 200 is omitted in FIG. 1.

Referring to FIGS. 1 and 2, a memory module testing apparatus 1 comprises a motherboard 100 and interface board 200.

Motherboard 100 may take any form that can be used in a device in which target memory module 210 can be mounted, such as a desktop computer, a notebook computer, a palmtop computer, a network computer, a communication device, or a switch board. In accordance with an exemplary embodiment of the present invention, motherboard 100 supports a standard DIMM that is usually used in a desktop computer.

Motherboard 100 sets an execution environment of the system in which motherboard 100 is mounted (e.g., a desktop computer), stores multiple data, and allows a computer to operate stably and input and output data smoothly. Motherboard 100 may be of a reverse type in which the face of motherboard 100 on which a plurality of chips is mounted (i.e., the face of motherboard 100 shown in FIG. 1) is substantially parallel to interface board 200, but faces away from interface board 200.

In motherboard 100, a chipset 110 and a plurality of slots (not shown) are formed on a board body comprising a conductive pattern and an insulating board.

"Chipset 110" collectively refers to a plurality of integrated circuits mounted on motherboard 100, and microchips and circuits of chipset 110 perform hardware control of the entire system in which motherboard 100 is mounted. In other words, chipset 110 manages signal exchange between a processor, a memory device, and the plurality of slots of motherboard 100; and controls bus buffering and data flow.

Although not shown in FIGS. 1 and 2, the plurality of slots of motherboard 100 may comprise a standard slot, a peripheral device connector, and a peripheral component interconnect/industry standard architecture (PCI/ISA) slot. In particular, a standard DIMM may be mounted in the standard slot. In accordance with an exemplary embodiment of the present invention, the standard DIMM may have 184 pins and the standard slot may comprise a first standard slot and a second standard slot.

Interface board 200 interfaces target memory module 210 to motherboard 100. Interface board 200 comprises a test slot 220, a first switching unit 230, a second memory unit 240, a third memory unit 245, a second switching unit 260, and a third switching unit 280 arranged in relation to interface board 200 comprising a conductive pattern formed on an insulating board (e.g., a printed circuit board or PCB).

Target memory module 210 is mounted in test slot 220, and test slot 220 is electrically connected to the standard slots on motherboard 100. For example, since the standard DIMM is mounted in the standard slot, the standard slot comprises 184 pins. A SODIMM is mounted in test slot 220, so test slot 220 comprises 200 pins. However, the standard slot and test slot 220 can be interfaced with each other. The detailed relationship between the standard slot and test slot 220 can be seen in a schematic diagram of target memory module 210, i.e., a schematic diagram of the SODIMM or the standard DIMM (neither of which is provided herein). Although not shown in FIGS. 1 and 2, test slot 220 may be directly connected to the standard slot or electrically connected to the standard slot through an interface slot (not shown).

A first memory unit 212, which stores serial presence detect (SPD) information, is mounted on target memory module 210. When target memory module 210 comprises 2 ranks, first memory unit 212 stores SPD information related to a 2-rank memory module. For example, first memory unit 212 may store SDP information related to a ×16 2-rank SODIMM. In particular, a first memory module 212 that stores SPD information is needed in a DDR2 module having 168 pins or 200 pins. The stored SPD information may comprise the size, speed, supply voltage, driving capability, number of matrix addresses, and manufacturer of a ×16 2-rank SODIMM; and the manufacturer of a random access memory (RAM).

First memory unit 212 may be, for example, an 8-pin serial electrically erasable programmable read-only memory (EEPROM) chip that is usually used in a synchronous dynamic random access memory (SDRAM). However, first memory unit 212 may be realized using any type of storage medium capable of storing the SPD information. In particular, in accordance with an exemplary embodiment of the present invention, after the booting process of memory module testing apparatus 1 is executed, whether or not the SPD information stored in first memory unit 212 is correct is tested.

First switching unit 230 controls paths through which a plurality of chipset signals reach test slot 220. In particular, selected chipset signals are used independently by rank in target memory module 210 and will be referred to hereinafter as individual "chipset-by-rank signals." For example, the chipset-by-rank signals may be chip select (CS) signals CS1 and CS2 and clock enable (CKE) signals CKE1 and CKE2. Here, CS signals CS1 and CS2 are used to select SDRAMs mounted on target memory module 210 and CKE signals CKE1 and CKE2 are memory clock enable signals for the SDRAMs selected by CS signals CS1 and CS2. First switching unit 230, in accordance with an exemplary embodiment of the present invention may comprise a plurality of dip switches and a digital bus switch.

Second memory unit 240 stores SPD information of a memory module that can be recognized by chipset 110 (i.e., a ×16 1-rank memory module) and is mounted on interface board 200. In accordance with an exemplary embodiment of the present invention, when SPD information of a memory module comprising 2 ranks is stored in first memory unit 212, SPD information of a memory module comprising 1 rank may be stored in second memory unit 240. For example, when SPD information of a ×16 2-rank SODIMM is stored in first memory unit 212, SPD information of a ×16 1-rank SODIMM is stored in second memory unit 240. In that case, the SPD information stored in second memory unit 240 is read when memory module testing apparatus 1 boots. The read SPD information is used to initialize a semiconductor memory module and set the timing of memory module testing apparatus 1. For example, the stored SPD information may include the size, speed, supply voltage, driving capability, number of matrix addresses, and the manufacturer of the ×16 1-rank SODIMM; and the manufacturer of a RAM.

Second memory unit 240 may comprise memory devices 241 and 242. Since the ×16 1-rank SODIMM may be one of various types, such as a 256 Mbyte-type ×16 1-rank SODIMM or a 512 Mbyte-type ×16 1-rank SODIMM, second memory unit 240, which stores the SPD information about the ×16 1-rank SODIMM, may comprise various types of memory devices. In other words, memory device 241 of second memory unit 240 may store SPD information about a 256 Mbyte-type ×16 1-rank SODIMM and memory device 242 of second memory unit 240 may store SPD information about a 512 Mbyte-type ×16 1-rank SODIMM.

Third memory unit 245 stores SPD information of a memory module that can be recognized by chipset 110 (i.e., a ×16 1-rank memory module) and is mounted on interface board 200. As an example, when SPD information about a ×16 2-rank SODIMM is stored in first memory unit 212, SPD information about a ×16 1-rank SODIMM is stored in third memory unit 245. Third memory unit 245 comprises memory devices 246 and 247 that may store SPD information about a 256 Mbyte-type ×16 1-rank SODIMM and a 512 Mbyte-type ×16 1-rank SODIMM, respectively.

Second switching unit 260 is mounted on interface board 200 and selectively provides a driving signal SDA0 to at least one of first memory unit 212, which stores SPD information, and second memory unit 240, which also stores SPD information. During the booting process for memory module testing apparatus 1, second switching unit 260 provides driving signal SDA0 to second memory unit 240 to enable chipset 110 to read information stored in second memory unit 240. After memory module testing apparatus 1 finishes booting, second switching unit 260 provides driving signal SDA0 to first memory unit 212 to allow information stored in first memory unit 212 to be tested. In one embodiment, each one of driving signals SDA0 and SDA1 may comprise a send data with acknowledgement signal (SDA) and/or a power signal, however driving signals SDA0 and SDA1 need not be limited to these signals. Second switching unit 260 may be a digital bus switch controlled by a control signal. The control signal may be provided from outside of memory module testing apparatus 1 or from within memory module testing apparatus 1.

Third switching unit 280 receives driving signal SDA0 from second switching unit 260 and selectively provides driving signal SDA0 to memory devices 241 and 242 of second memory unit 240. In other words, third switching unit 280 may comprise a plurality of switches that connect memory devices 241 and 242 of second memory unit 240 to second switching unit 260. Each switch of the plurality of switches may be a dip switch that can be turned on or off in accordance with a user's requirements.

A fourth switching unit 290 receives a driving signal SDA1, which is provided to a second test slot 222, and selectively provides driving signal SDA1 to memory devices 246 and 247 of third memory unit 245. In other words, fourth switching unit 290 may comprise a plurality of switches that connect memory devices 246 and 247 of third memory unit 245 with second test slot 222.

Figure 3:
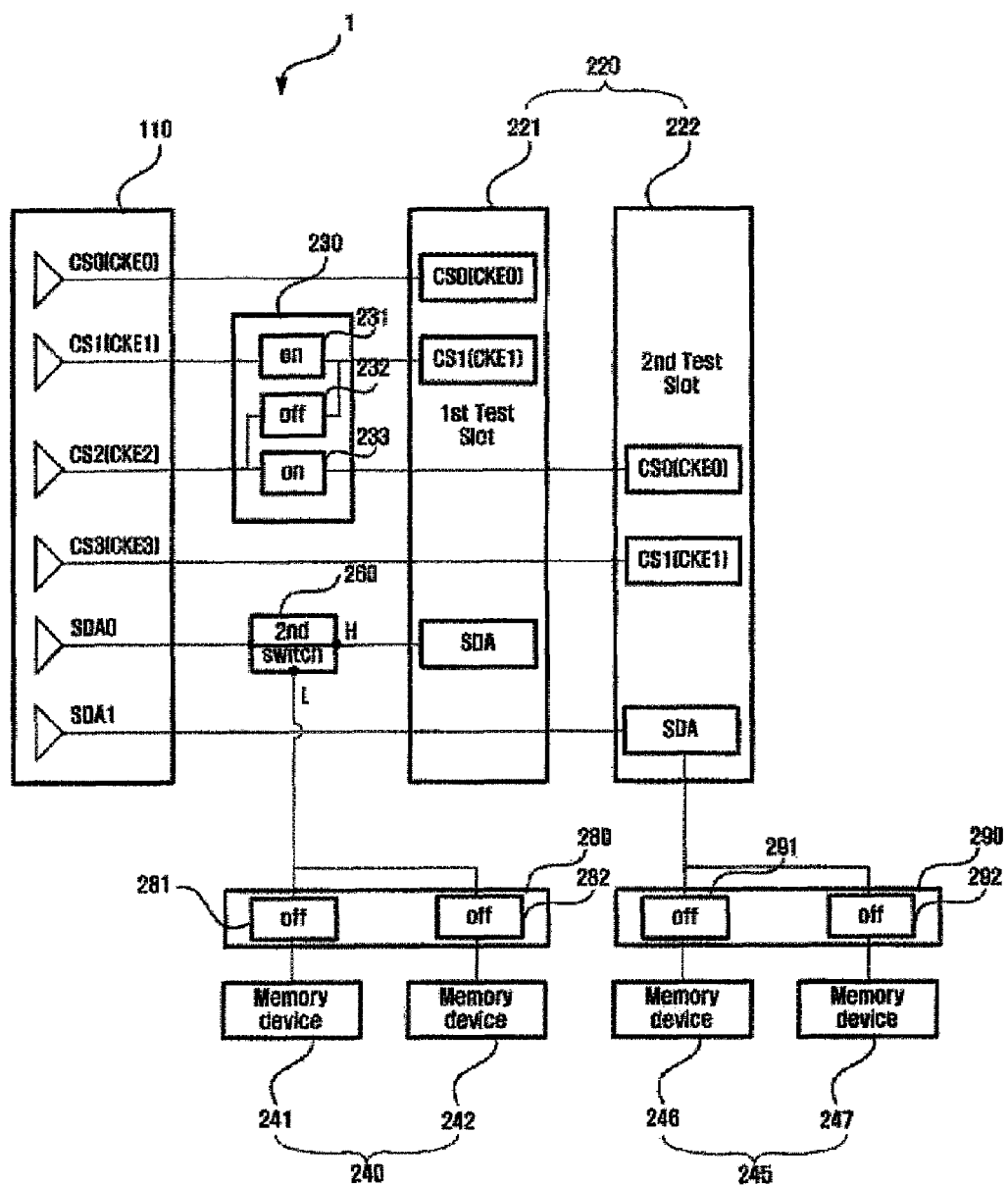
FIG. 3 is a block diagram illustrating an operation of a memory module testing apparatus in accordance with an exemplary embodiment of the present invention.
Figure 4:
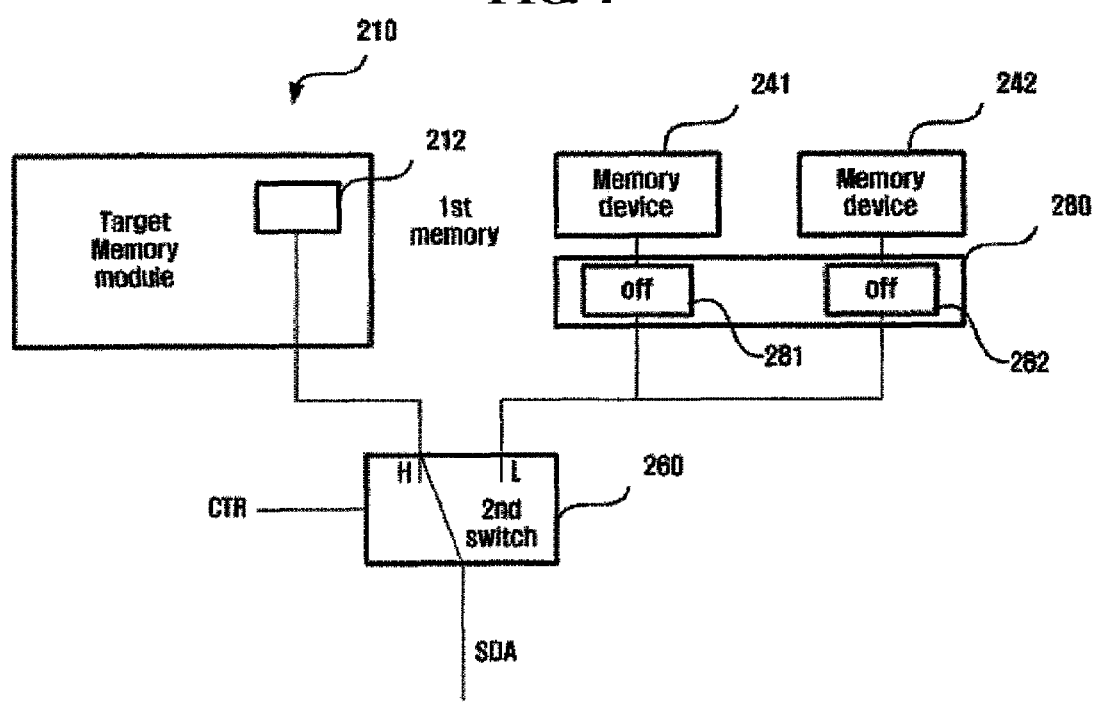
FIG. 4 is a block diagram illustrating an operation of a second switching unit of a memory module testing apparatus in accordance with an exemplary embodiment of the present invention.
Figure 5:
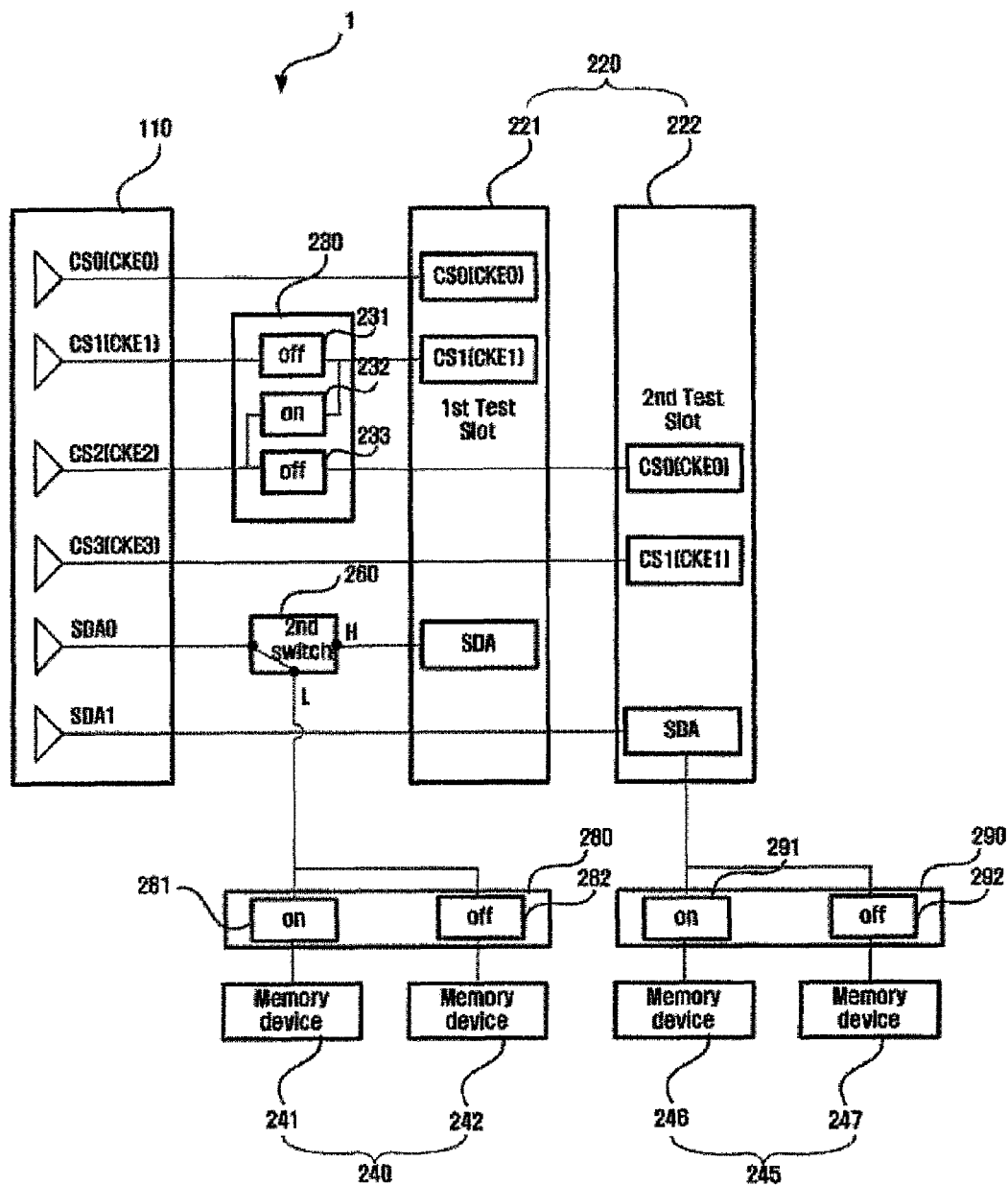
FIGS. 5 and 6 are block diagrams illustrating an operation of a memory module testing apparatus in accordance with an exemplary embodiment of the present invention; and, FIG. 7 is a flowchart illustrating a memory module testing method in accordance with an exemplary embodiment of the present invention.
Figure 6:
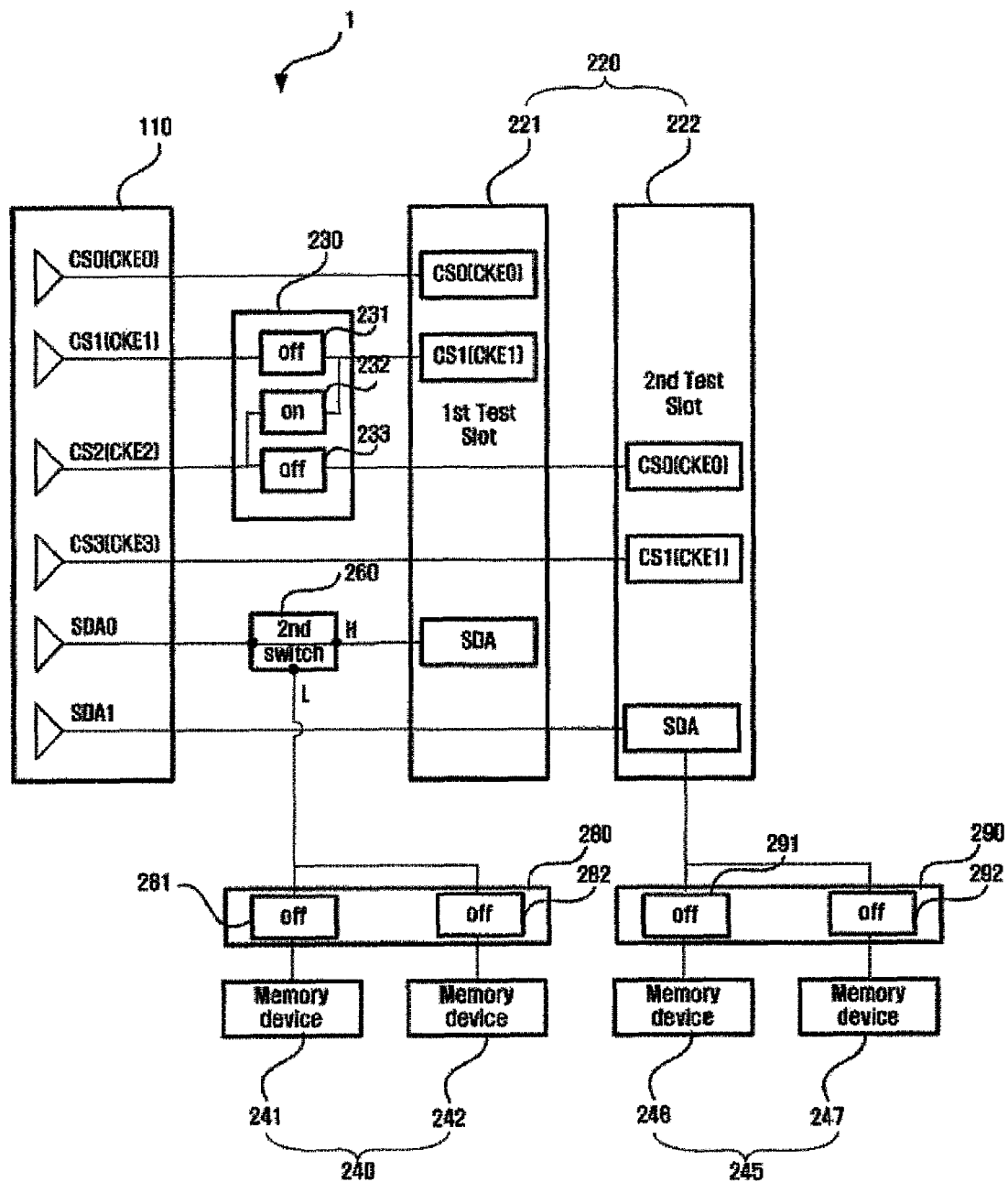
Figure 7:
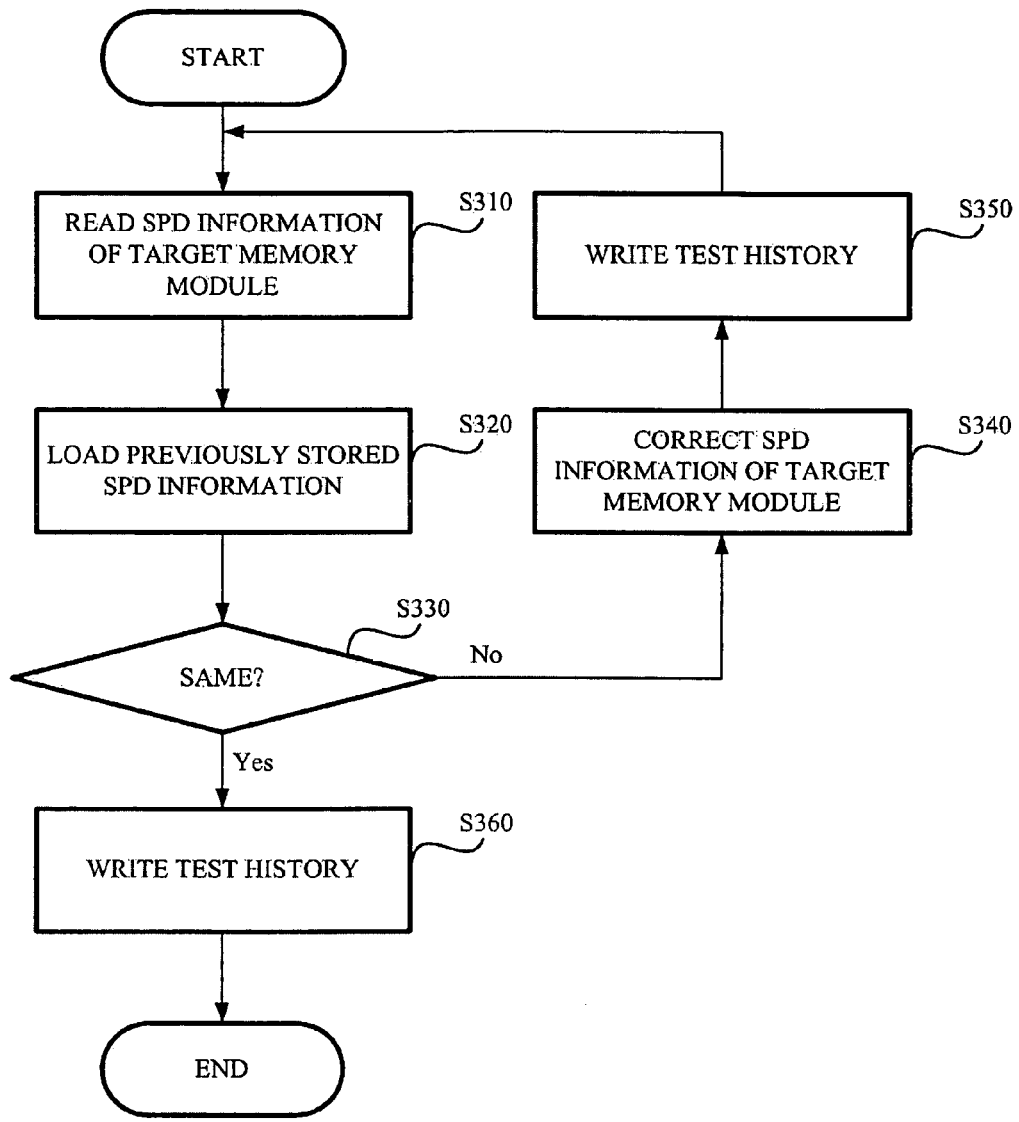

FIGS. 3, 5, and 6 are block diagrams illustrating operations of memory module testing apparatus 1 in accordance with an exemplary embodiment of the present invention. FIG. 4 is a block diagram illustrating an operation of second switching unit 260 of memory module testing apparatus 1 in accordance with an exemplary embodiment of the present invention. FIG. 7 is a flowchart illustrating a memory module testing method in accordance with an exemplary embodiment of the present invention.

Referring to FIG. 3, second memory unit 240 stores SPD information about a ×16 1-rank SODIMM. First switching unit 230 comprises switches 231, 232, and 233; third switching unit 280 comprises switches 281 and 282; and fourth switching unit 290 comprises switches 291 and 292. Each of switches 231, 232, 233, 281, 282, 291, and 292 may be realized with dip switches, for example. Second switching unit 260 is a digital bus switch. Switch 231 of first switching unit 230 selectively connects CS signal CS1 (CKE signal CKE1) of chipset 110 to a pin CS1 (CKE1) of a first test slot 221. Switch 232 of first switching unit 230 selectively connects CS signal CS2 (CKE signal CKE2) of chipset 110 to pin CS1 (CKE1) of first test slot 221. Switch 233 of first switching unit 230 selectively connects CS signal CS2 (CKE signal CKE2) of chipset 110 to a pin CS0 (CKE0) of second test slot 222. Switches 281 and 282 of third switching unit 280 connect second switching unit 260 to memory devices 241 and 242 of second memory unit 240, respectively. Switches 291 and 292 of fourth switching unit 290 connect second test slot 222 with memory devices 246 and 247 of third memory unit 245, respectively.

Hereinafter, a method of testing a ×16 1-rank SODIMM using memory module testing apparatus 1 in accordance with an exemplary embodiment of the present invention will be described with reference to FIGS. 3 and 4.

A first ×16 1-rank SODIMM and a second ×16 1-rank SODIMM are mounted in first test slot 221 and second test slot 222, respectively. Throughout the description of the method of testing the ×16 1-rank SODIMM, the first and second ×16 1-rank SODIMMs will be referred to as first and second target memory modules 210, respectively.

Switches 231, 232, and 233 of first switching unit 230 are turned on, off, and on, respectively. Thus, a CS signal CS0 (CKE signal CKE0) and CS signal CS1 (CKE signal CKE1) of chipset 110 are connected to a pin CS0 (CKE0) and pin CS1 (CKE1) of first test slot 221, respectively. Also, CS signal CS2 (CKE signal CKE2) and a CS signal CS3 (CKE signal CKE3) of chipset 110 are connected to pin CS0 (CKE0) and a pin CS1 (CKE1) of second test slot 222, respectively. Since ×16 1-rank SODIMMs are mounted in each of first and second test slots 221 and 222, CS signal CS0 (CKE signal CKE0) is only input to first target memory module 210, which is the ×16 1-rank SODIMM mounted in first test slot 221, and pin CS1 (CKE1) floats. CS signal CS2 (CKE signal CKE2) is only input to second target memory module 210, which is the ×16 1-rank SODIMM mounted in second test slot 222, and CS signal CS3 (CKE signal CKE3) floats. Chipset-by-rank signals are provided to first test slot 221 and second test slot 222.

Second switching unit 260 provides driving signal SDA0 to a pin SDA of first memory unit 212 in response to a control signal CTR having a logic high level. As described above, the driving signal may be a power signal.

Motherboard 100 then only recognizes first memory unit 212 mounted on first target memory module 210 mounted in first test slot 221 and does not recognize second memory unit 240 mounted on interface board 200. Thus, SPD information about a ×16 1-rank memory module, which is stored in first memory unit 212, is read to initialize first target memory module 210 and set the initial timing of memory module testing apparatus 1. In this way, the ×16 1-rank memory module mounted in first test slot 221 can be tested. Moreover, whether or not SPD information stored in first memory unit 212 is correct can be tested.

In accordance with an exemplary embodiment of the present invention, a 256 Mbyte-type ×16 1-rank memory module may be tested, but the present invention is not limited to testing memory modules having a size of 256 Mbytes.

To test a 512 Mbyte-type ×16 1-rank memory module, switch 282 of third switching unit 280 and switch 292 of fourth switching unit 290 are turned on. Chipset 110 then only recognizes second memory unit 240 mounted on interface board 200 and third memory unit 245 mounted on interface board 200 and does not recognize first memory unit 212 mounted on a target memory module 210. In other words, driving signals SDA0 and SDA1 of chipset 110 are provided to second memory unit 240 and third memory unit 245, respectively, and chipset 110 only recognizes SPD information about a recognizable memory module, i.e., SPD information about a ×16 1-rank memory module, which is stored in second memory unit 240 and third memory unit 245. Thus, in accordance with an exemplary embodiment of the present invention, chipset 110 recognizes that one ×16 1-rank memory module is mounted on each of first test slot 221 and second test slot 222 (thus, two ×16 1-rank memory modules are mounted in total) and sets the timing of a driving signal for at least one target memory module 210.

Hereinafter, a method of testing a ×16 2-rank SODIMM using memory module testing apparatus 1 in accordance with an exemplary embodiment of the present invention will be described with reference to FIGS. 5 and 6.

Referring to FIG. 5, a ×16 2-rank SODIMM is mounted in first test slot 221 and nothing is mounted in second test slot 222. Throughout the description of the method of testing the ×16 2-rank SODIMM, the ×16 2-rank SODIMM will be referred to as target memory module 210.

Switches 231, 232, and 233 of first switching unit 230 are turned off, on, and off, respectively. Thus, CS signal CS2 (CKE signal CKE2) of chipset 110 is connected to pin CS1 (CKE1) of first test slot 221. On the other hand, CS signal CS1 (CKE signal CKE1) of chipset 110 and pin CS0 (CKE0) of second test slot 222 are electrically isolated. In accordance with an exemplary embodiment of the invention, switches 231, 232, and 233 of first switching unit 230 operate during the booting process of memory module testing apparatus 1; however, they may operate after the completion of the booting process as well.

Second switching unit 260 provides driving signal SDA0 to second memory unit 240 in response to control signal CTR having a logic low level. Also, switch 281 of third switching unit 280, which connects second switching unit 260 and second memory unit 240, is turned on. In addition, switch 291 of fourth switching unit 290, which connects second test slot 222 and third memory unit 245, is turned on. Switches 282 and 292 of third switching unit 280 and fourth switching unit 290, respectively, remain off.

Since switches 231, 232, and 233 of first switching unit 230 are turned off, on, and off, respectively, first switching unit 230 provides selected chipset-by-rank signals, which first switching unit 230 provides to second test slot 222 when testing a ×16 1-rank memory module, to first test slot 221. In other words, a ×16 2-rank memory module mounted in first test slot 221 is tested using only CS signal CS0 (CKE signal CKE0) and CS signal CS2 (CKE signal CKE2). Thus, a ×16 2-rank SODIMM can be tested using motherboard 100, which supports a ×16 1-rank SODIMM.

Referring to FIG. 6, once the timing of the driving signal for target memory module 210 has been set during the booting process of memory module testing apparatus 1, second switching unit 260 is set to a logic high state in response to control signal CTR having a logic high level. Thus, driving signal SDA0 of chipset 110 is connected to a pin SDA of first test slot 221. Since second memory unit 240 is electrically isolated from chipset 110 as a result of second switching unit 260 being set to a logic high state, it makes no difference whether switches 281 and 282 of second switching unit 280 are on or off.

In accordance with an exemplary embodiment of the present invention, when testing a ×16 2-rank SODIMM, second memory unit 240 and third memory unit 245, which are additionally mounted on interface board 200, are used during the booting process of memory module testing apparatus 1. Thus, whether or not information stored in first memory unit 212 mounted on target memory module 210 is correct can be tested by electrically connecting driving signal SDA0 of chipset 110 to pin SDA of first test slot 221 after the completion of the booting process.

Hereinafter, a method of testing SPD information stored in first memory unit 212 mounted on target memory module 210 will be described in detail with reference to FIGS. 6 and 7.

Throughout the description of the method of testing the SPD information stored in first memory unit 212 mounted on target memory module 210, "target memory module 210" will refer to a ×16 2-rank SODIMM.

First, SPD information about a ×16 2-rank SODIMM, which is stored in first memory unit 212 mounted on target memory module 210 is read in step S310. Then, previously stored SPD information about a ×16 2-rank SODIMM is loaded in step S320. For example, SPD information about a ×16 2-rank SODIMM may have been previously stored on a hard disk or on a ROM mounted on motherboard 100.

In step 330, whether or not the SPD information of target memory module 210 is the same as the previously stored SPD information is determined. For example, the SPD information of target memory module 210 and the previously stored SPD information may be compared bit-by-bit to determine whether or not they are the same.

If the SPD information of target memory module 210 and the previously stored SPD information are not the same, then, in step 340, the SPD information of target memory module 210 is corrected with reference to the previously stored SPD information. A test history is stored in first memory unit 212 mounted on target memory module 210 in step S350. First memory unit 212 mounted on target memory module 210 may be, for example, an EEPROM with a size of 1 Kbyte. The size of the SPD information stored in first memory unit 212 is about 128 bytes. Thus, data indicating a test date, a testing apparatus, and a test operator; as well as incorrectly written SPD information, and corrected SPD information may each be written to an area of first memory unit 212 that is not occupied by the SPD information. Thereafter, the corrected SPD information of target memory module 210 is read again and compared with the previously stored SPD information (steps S310, S320, S330).

If the SPD information of target memory module 210 and the previously stored SPD information are the same, then, in step S360, a test history is written to an area of first memory unit 212 that is not occupied by the SPD information. In step S360, the test history comprises only data indicating a test date, a testing apparatus, and a test operator.

The test history is written for the following reasons. After a memory module product is released into the market, a memory module may operate abnormally due to an error in SPD information. Such an abnormal operation may result in customer warranty claim. By reviewing the test history for the SPD information, the user's claim may be efficiently addressed. In addition, by writing a test history it is possible to easily find a failure that occurs during the manufacture of first memory units 212, which store SPD information.

It is possible to test various types of target memory modules using the memory module testing apparatus of the present invention. For example, a ×16 2-rank SODIMM can be tested using a testing apparatus that supports a standard DIMM. In addition, although a second memory unit is additionally mounted on an interface board adapted to test a ×16 2-rank SODIMM, a first memory unit mounted on a target memory module can be tested using a digital bus switch after the completion of the booting process of the testing apparatus.

While the present invention has been particularly shown and described with reference to exemplary embodiments thereof, it will be understood by those of ordinary skill in the art that various changes in form and detail may be made therein without departing from the scope of the invention as defined by the following claims.

What is claimed is:

1. A memory module testing apparatus comprising:
a test slot for receiving a target memory module, the target memory module comprising a first memory for storing first information related to the target memory module;
a second memory for storing second information related to a memory module; and
a first switch for selectively providing a driving signal to the first memory and the second memory,
wherein the first switch provides the driving signal to the second memory during a booting process to enable reading of the second information for the booting process, and provides the driving signal to the first memory after the booting process to enable reading of the first information.

2. The memory module testing apparatus of claim 1, wherein the first switch comprises a digital bus switch.

3. The memory module testing apparatus of claim 1, wherein the second memory comprises a plurality of memory devices and a second switch for selectively providing the driving signal to the plurality of memory devices.

4. The memory module testing apparatus of claim 3, wherein the second switch comprises a plurality of dip switches for selectively connecting the plurality of memory devices to the first switch.

5. The memory module testing apparatus of claim 1, wherein the first information stored in the first memory is related to a memory module comprising 2 ranks, and the second information stored in the second memory related to a memory module comprising 1 rank.

6. The memory module testing apparatus of claim 5, wherein the first memory comprises an electrically erasable programmable read-only memory (EEPROM) and the first information is related to a ×16 2-rank small outline dual in-line memory module (SODIMM), and wherein the second memory comprises at least one EEPROM and the second information is related to a ×16 1-rank SODIMM.

7. The memory module testing apparatus of claim 1, wherein the driving signal comprises a send data with acknowledgement (SDA) signal or a power signal.

8. A memory module testing apparatus comprising:
a first test slot for receiving a target memory module, the target memory module comprising a first memory for storing first information related to the target memory module;
a second test slot;
a second memory for storing second information related to a memory module;
a first switch for selectively switching chipset signals between the first test slot and the second test slot; and
a second switch for selectively providing a first driving signal to the first memory and the second memory,
wherein the first switch provides the driving signal to the second memory during a booting process to enable reading of the second information for the booting process, and provides the driving signal to the first memory after the booting process to enable reading of the first information.

9. The memory module testing apparatus of claim 8, wherein the chipset signals comprise chipset-by-rank signals associated with the target memory module.

10. The memory module testing apparatus of claim 9, wherein the chipset-by-rank signals comprise a chip select (CS) signal and a clock enable (CKE) signal.

11. The memory module testing apparatus of claim 8, wherein the second switch comprises a digital bus switch.

12. The memory module testing apparatus of claim 8, wherein the second memory comprises a plurality of memory devices and a third switch for selectively providing the first driving signal to the plurality of memory devices.

13. The memory module testing apparatus of claim 12, wherein the third switch comprises a plurality of dip switches for connecting the plurality of memory devices to the second switch.

14. The memory module testing apparatus of claim 8, further comprising:
a third memory electrically connected to the second test slot, the third memory storing information related to a memory module.

15. The memory module testing apparatus of claim 14, wherein the third memory comprises a plurality of memory devices and a third switch for selectively providing a second driving signal to the plurality of memory devices.

16. The memory module testing apparatus of claim 15, wherein each of the first and second driving signals comprises a send data with acknowledgement (SDA) signal or a power signal.

17. The memory module testing apparatus of claim 15, wherein the third switch comprises a plurality of dip switches for selectively connecting the plurality of memory devices of the third memory to the second test slot.

18. The memory module testing apparatus of claim 14, wherein the first memory stores information related to a memory module comprising 2 ranks, and the second and third memories respectively store information related to a memory module comprising 1 rank.

19. The memory module testing apparatus of claim 18, wherein the first memory comprises an EEPROM storing information related to a ×16 2-rank small outline dual in-line memory module SODIMM, and the second and third memories respectively comprise at least one EEPROM storing information related to a ×16 1-rank SODIMM.

20. A memory module testing method for a memory module testing apparatus comprising a chipset, first and second test slots, a target memory module mounted in the first test slot and comprising a first memory storing first information related to the target memory module, a second memory, and first and second switches; the method comprising:
providing a driving signal to the second memory during a booting process of the memory module testing apparatus to enable the chipset to read second information stored in the second memory unit; and
providing the driving signal to the first memory after completion of the booting process to allow the first information stored in the first memory unit to be tested,
wherein the first information is not read during the booting process.

21. The method of claim 20 further comprising:
providing chipset-by-rank signals to the first test slot and the second test slot when a ×16 1-rank small outline dual in-line memory module SODIMM is mounted in each of the first and second test slots.

22. The method of claim 20 further comprising:
providing selected chipset-by-rank signals to the first test slot when a ×16 2-rank SODIMM is mounted in the first test slot, wherein the selected chipset-by-rank signals are provided to the second test slot when a ×16 1-rank SODIMM is mounted in each of the first and second test slots.

23. The method of claim 20 further comprising:
reading the first information stored in the first memory, the first information comprising serial presence detect (SPD) information;
loading previously stored SPD information; and
determining whether the SPD information read from the first memory is the same as the previously stored SPD information.

24. The method of claim 23 further comprising:
correcting the SPD information stored in the first memory if the SPD information read from the first memory is not the same as the previously stored SPD information.

25. The method of claim 24 further comprising:
writing a test history to the first memory.

* * * * *